(12) United States Patent
Deng

(10) Patent No.: US 12,324,288 B2
(45) Date of Patent: Jun. 3, 2025

(54) DISPLAY PANEL, PRINTING DEVICE AND METHOD OF MANUFACTURING THE DISPLAY PANEL

(71) Applicant: TCL CHINA STAR OPTOELECTRONICS TECHNOLOGY CO., LTD., Guangdong (CN)

(72) Inventor: Hongzhao Deng, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/758,028

(22) PCT Filed: May 31, 2022

(86) PCT No.: PCT/CN2022/096324
§ 371 (c)(1),
(2) Date: Jun. 26, 2022

(87) PCT Pub. No.: WO2023/221171
PCT Pub. Date: Nov. 23, 2023

(65) Prior Publication Data
US 2024/0170626 A1 May 23, 2024

(30) Foreign Application Priority Data
May 20, 2022 (CN) .......................... 202210553830.1

(51) Int. Cl.
*H10H 20/857* (2025.01)
*H01L 25/075* (2006.01)
*H10H 20/01* (2025.01)

(52) U.S. Cl.
CPC ....... *H10H 20/857* (2025.01); *H01L 25/0753* (2013.01); *H10H 20/0364* (2025.01)

(58) Field of Classification Search
CPC .............. H10H 20/857; H10H 20/0364; H01L 25/0753; H10D 8/043; H10D 30/0295; B41F 17/00
See application file for complete search history.

(56) References Cited

U.S. PATENT DOCUMENTS 6,025,901 A * 2/2000 Adachi ............... G02F 1/13452
349/158
12,205,927 B2 * 1/2025 Liu ....................... G06F 3/1423
(Continued)

FOREIGN PATENT DOCUMENTS

CN 107994058 A 5/2018
CN 108269823 A 7/2018
(Continued)

OTHER PUBLICATIONS

Japanese Office Action issued in corresponding Japanese Patent Application No. 特願2022-548558 dated Jun. 11, 2024, pp. 1-4.
(Continued)

*Primary Examiner* — Victor A Mandala
(74) *Attorney, Agent, or Firm* — PV IP PC; Wei Te Chung

(57) ABSTRACT

The present invention relates to a display panel, a printing device, and a method of manufacturing the display panel. In the present invention, the width of the first conductor and the second conductor can be increased by matching the printing device with the display panel, and the risk of the open circuit between the first conductor and the first bonding terminal and the open circuit between the second conductor and the second bonding terminal is reduced. The first conductor and the second conductor of the present invention are not on the
(Continued)

same plane, so that the risk of short circuit between the first conductor and the second conductor can be reduced.

20 Claims, 7 Drawing Sheets

(56) References Cited

U.S. PATENT DOCUMENTS

| | | | | |
|---|---|---|---|---|
| 2008/0173881 | A1* | 7/2008 | Wang | H01L 25/0753 |
| | | | | 257/E25.02 |
| 2020/0243738 | A1* | 7/2020 | Feng | G02F 1/13336 |
| 2020/0259056 | A1* | 8/2020 | Hong | H01L 25/167 |
| 2021/0167121 | A1 | 6/2021 | Qi et al. | |
| 2021/0217806 | A1* | 7/2021 | Xi | H10H 29/142 |
| 2021/0327857 | A1* | 10/2021 | Li | H10D 64/511 |
| 2022/0052080 | A1* | 2/2022 | Kim | H01L 25/167 |
| 2023/0005986 | A1* | 1/2023 | Kang | G09G 3/32 |
| 2023/0217746 | A1* | 7/2023 | Lee | H01L 33/62 |
| | | | | 257/40 |
| 2023/0238498 | A1* | 7/2023 | Kim | H10H 20/857 |
| | | | | 257/79 |
| 2023/0268476 | A1* | 8/2023 | Lee | H01L 25/0753 |
| | | | | 257/79 |
| 2023/0343914 | A1* | 10/2023 | Chang | H10H 29/142 |

FOREIGN PATENT DOCUMENTS

| | | | | |
|---|---|---|---|---|
| CN | 110197814 | A | 9/2019 | |
| CN | 110767102 | A | 2/2020 | |
| CN | 111666005 | A | 9/2020 | |
| CN | 114188468 | A | 3/2022 | |
| CN | 114203042 | A | 3/2022 | |
| CN | 114280862 | A | 4/2022 | |
| CN | 114188468 | B * | 2/2024 | ........... H01L 27/156 |
| EP | 0614221 | A1 | 9/1994 | |
| JP | H1146061 | A | 2/1999 | |
| JP | 2020017580 | A | 1/2020 | |

OTHER PUBLICATIONS

International Search Report in International application No. PCT/CN2022/096324, mailed on Nov. 30, 2022.
Written Opinion of the International Search Authority in International application No. PCT/CN2022/096324, mailed on Nov. 30, 2022.
Chinese Office Action issued in corresponding Chinese Patent Application No. 202210553830.1 dated Mar. 8, 2025, pp. 1-5.
Journals of Screen Printing, Issue: 2015.2 Title: Printed and parallel wire composite LED circuit board without etching Su, Fangning; Huang, Zeguang.

* cited by examiner providing a substrate, the substrate comprising a first surface and a side printing surface perpendicular to the first surface; — S10 forming a plurality of bonding terminals parallel to and spaced apart from each other on the first surface of the substrate, wherein the bonding terminals comprise alternately arranged first bonding terminals and second bonding terminals; — S20 forming a plurality of first grooves at intervals on the side printing surface of the substrate, wherein the first grooves are disposed in a one-to-one correspondence with the first bonding terminals; and a first protrusion is formed between any adjacent two of the first grooves; and — S30 forming first conductors on the substrate on bottom surfaces of the first grooves and forming second conductors on the substrate on top surfaces of the first protrusions by a printing device, wherein the first conductors are disposed in a one-to-one correspondence with the first grooves, the first conductors are connected to the first bonding terminals in a one-to-one correspondence, the second conductors are disposed in a one-to-one correspondence with the first protrusions, the second conductors are connected to the second bonding terminals in a one-to-one correspondence; and any one of the first conductors and any one of the second conductors are non-conductive to each other. — S40

FIG. 6

DISPLAY PANEL, PRINTING DEVICE AND METHOD OF MANUFACTURING THE DISPLAY PANEL

BACKGROUND OF INVENTION

Field of Invention

The present application relates to the field of display technology, and in particular, to a display panel, a printing device, and a method of manufacturing the display panel.

Description of Prior Art

Today's new display field is developing rapidly, and people's demand for full-screens or super-large screens is gradually increasing. MLED is a general term for sub-millimeter light-emitting diode (mini LED) and micro light-emitting diode (micro LED). The MLED has the advantages of fast response, high color gamut, high PPI, and low energy consumption, and has gradually developed into a hot spot of future display technology.

The current mini LED and micro LED technologies are relatively complex and difficult, wherein the side printing process has a great influence on the yield of the display panel. As shown in FIG. 1 and FIG. 2, a side printing surface 1001 of the display panel 100 in the prior art is a plane. As shown in FIG. 3, in the prior art, printing heads 2002 of the printing device 200 protrude from the main body 2001 at the same height. Difficulties in the side printing process of using the printing device 200 in the prior art to dip a conductive liquid 1002 onto the side printing surface 1001 of the display panel 100 are mainly divided into two parts, one part comes from the open circuit of the conductive liquid 1002, and the other part comes from the short circuit of the conductive liquid 1002 caused by multiple side printing.

SUMMARY OF INVENTION

An object of the present invention is to provide a display panel, a printing device and a method of manufacturing the display panel, which can solve the problems of open circuit and short circuit of the conductive liquid in the existing side printing process, which result in low yield of the display panel and the like.

In order to solve the above problems, the present invention provides a display panel, which includes: a substrate including a first surface and a side printing surface perpendicular to the first surface; a plurality of bonding terminals disposed in parallel at intervals on a first surface of the substrate; wherein the bonding terminals include alternately arranged first bonding terminals and second bonding terminals; a plurality of first grooves disposed at intervals on the side printing surface of the substrate, wherein the first grooves are disposed in a one-to-one correspondence with the first bonding terminals; and a first protrusion is formed between any adjacent two of the first grooves; a plurality of first conductors disposed on the substrate on bottom surfaces of the first grooves, wherein the first conductors are disposed in a one-to-one correspondence with the first grooves, and are connected to the first bonding terminals in a one-to-one correspondence; and a plurality of second conductors disposed on the substrate on top surfaces of the first protrusions, wherein the second conductors are disposed in a one-to-one correspondence with the first protrusions, and are connected to the second bonding terminals in a one-to-one correspondence; wherein any one of the first conductors and any one of the second conductors are non-conductive to each other.

Further, a material of the first conductors is same as a material of the second conductors.

Further, any two of the first grooves have a same shape and size.

Further, any two of the first protrusions have a same width.

In order to solve the above problems, the present invention also provides a printing device, which is used for preparing the display panel of the present invention. The printing device includes: a main body; a plurality of second grooves disposed on a surface of one side of the main body at intervals, wherein a second protrusion is formed between any adjacent two of the second grooves; a plurality of first printing heads mounted on the main body on top surfaces of the second protrusions, wherein the first printing heads are disposed in a one-to-one correspondence with the second protrusions; and a plurality of second printing heads mounted on the main body on bottom surfaces of the second grooves, wherein the second printing heads are disposed in a one-to-one correspondence with the second grooves.

Further, any two of the second grooves have a same shape and size.

Further, any two of the second protrusions have a same width.

Further, the printing apparatus further includes: a plurality of hydrophobic and oleophobic layers are arranged on two sidewalls of each of the second grooves.

Further, a material of the hydrophobic and oleophobic layers includes one or more of metal phosphates, metal polyphosphate compounds, polytetrafluoroethylene, and fluorinated polyethylene.

Further, a distance between two of the hydrophobic and oleophobic layers in any one of the second grooves is greater than or equal to a width of the first protrusions.

Further, a distance between the hydrophobic and oleophobic layers on two sidewalls of any one of the second protrusions is less than or equal to a width of the first grooves.

In order to solve the above problems, the present invention also provides a method of manufacturing a display panel, which includes the following steps: providing a substrate, the substrate including a first surface and a side printing surface perpendicular to the first surface; forming a plurality of bonding terminals parallel to and spaced apart from each other on the first surface of the substrate, wherein the bonding terminals include alternately arranged first bonding terminals and second bonding terminals; forming a plurality of first grooves at intervals on the side printing surface of the substrate, wherein the first grooves are disposed in a one-to-one correspondence with the first bonding terminals; and a first protrusion is formed between any adjacent two of the first grooves; and forming first conductors on the substrate on bottom surfaces of the first grooves and forming second conductors on the substrate on top surfaces of the first protrusions by a printing device, wherein the first conductors are disposed in a one-to-one correspondence with the first grooves, the first conductors are connected to the first bonding terminals in a one-to-one correspondence, the second conductors are disposed in a one-to-one correspondence with the first protrusions, the second conductors are connected to the second bonding terminals in a one-to-one correspondence; and any one of the first conductors and any one of the second conductors are non-conductive to each other; wherein the printing device includes: a main body; a plurality of second grooves disposed on a surface of one side of the main body at intervals, wherein a second protrusion is formed between any adjacent two of the second grooves; a plurality of first printing heads mounted on the main body on top surfaces of the second protrusions, wherein the first printing heads are disposed in a one-to-one correspondence with the second protrusions; and a plurality of second printing heads mounted on the main body on bottom surfaces of the second grooves, wherein the second printing heads are disposed in a one-to-one correspondence with the second grooves.

Further, the step of forming first conductors on bottom surfaces of the first grooves and forming second conductors on top surfaces of the first protrusions further includes: first providing a hydrophobic and oleophobic layer on two sidewalls of each of the second grooves, then using the printing device to dip a conductive liquid, aligning the first printing heads with the first grooves, pressing the main body, printing the conductive liquid on the first printing heads to the substrate on the bottom surfaces of the first grooves to form the first conductors, and printing the conductive liquid on the second printing heads to the substrate on the top surfaces of the first protrusions to form the second conductors.

Further, forming the plurality of first grooves at intervals on the side printing surface of the substrate by using one of laser cutting, water jet cutting, dry etching, and wet etching.

Further, a distance between two of the hydrophobic and oleophobic layers in any one of the second grooves is greater than or equal to a width of the first protrusions.

Further, a distance between the hydrophobic and oleophobic layers on two sidewalls of any one of the second protrusions is less than or equal to a width of the first grooves.

Further, when the main body is pressed, the first protrusions are fitted into the second grooves, and the second protrusions and the second printing heads are fitted into the first grooves.

In the present invention, the width of the first conductor and the second conductor can be increased by matching the printing device with the display panel, and the risk of the open circuit between the first conductor and the first bonding terminal and the open circuit between the second conductor and the second bonding terminal is reduced. The first conductor and the second conductor of the present invention are not on the same plane, so that the risk of short circuit between the first conductor and the second conductor can be reduced. In the present invention, a hydrophobic and oleophobic layer is prepared on two sidewalls of each of the second grooves. When the printing device is dipped in the conductive liquid, the two sidewalls of the second groove will not be dipped in the conductive liquid. As a result, the substrate on the two sidewalls of the groove is not covered with conductive liquid, so that the short circuit between the first conductor and the second conductor can be further prevented. The process of the present invention is simple, and the compatibility of the printing device is hight. When the display panel of the present invention is used for splicing, a splicing seam is a concave-convex line, and the user's sensitivity to a contour of the concave-convex line is lower than the user's sensitivity to a straight line. In addition, users are used to observing from left to right and from top to bottom, and the splicing seam requires longer observation time and more information. Therefore, when the display panel of the present invention is spliced, the splicing seam is less obvious.

BRIEF DESCRIPTION OF DRAWINGS

In order to more clearly illustrate the technical solutions of the embodiments of the application, the drawings illustrating the embodiments will be briefly described below. Obviously, the drawings in the following description merely illustrate some embodiments of the present invention. Other drawings may also be obtained by those skilled in the art according to these figures without paying creative work.

FIG. 6 is a diagram showing steps of manufacturing the display panel according to the present invention.

Figure 1:
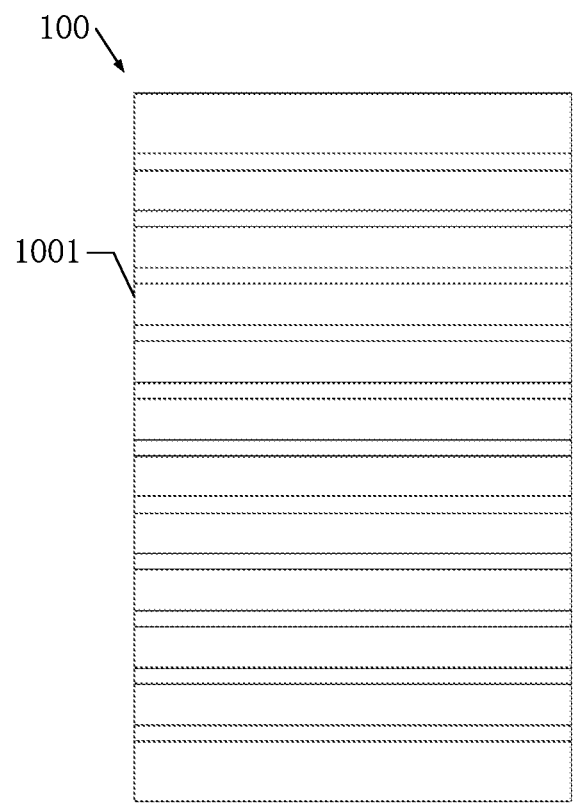
FIG. 1 is a top view of a display panel before side printing in the prior art.
Figure 2:
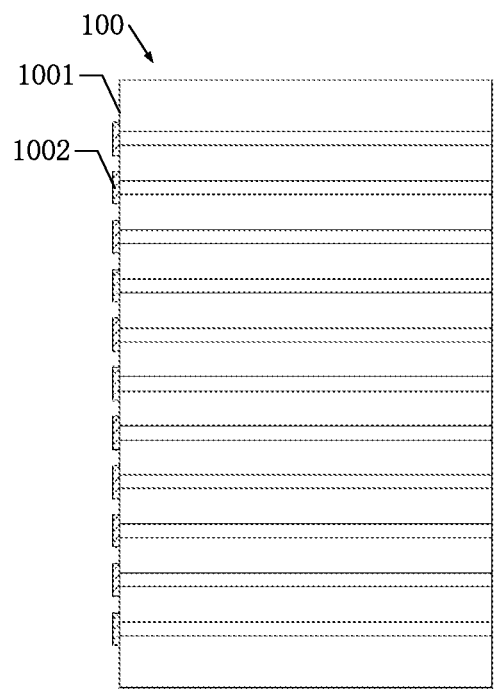
FIG. 2 is the top view of the display panel after the side printing in the prior art.
Figure 3:
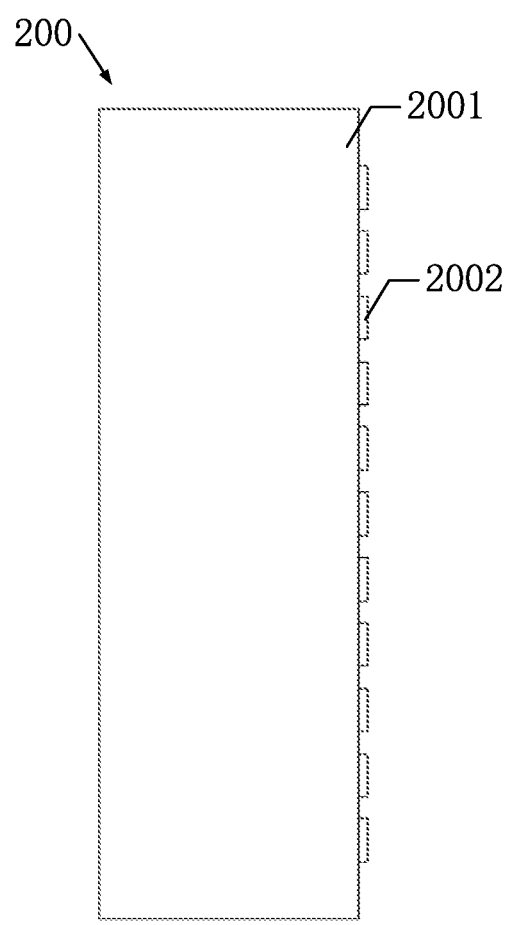
FIG. 3 is a schematic diagram of a printing device in the prior art.

Elements in the drawings are designated by reference numerals listed below.

1, display panel; 2, printing device;
11, substrate; 12, bonding terminal;
13, first groove; 14, first conductor;
15, second conductor; 16, first protrusion;
111, first surface; 112, side printing surface;
121, first bonding terminal; 122, second bonding terminal;
21, main body; 22, second groove;
23, first printing head; 24, second printing head;
25, hydrophobic and oleophobic layer; 26, second protrusion.

DETAILED DESCRIPTION OF PREFERRED EMBODIMENTS

The preferred embodiments of the present invention are described in detail below with reference to the accompanying drawings, in which FIG. Those skilled in the art will more readily understand how to implement the invention. The present invention may, however, be embodied in many different forms and embodiments, and the scope of the invention is not limited to the embodiments described herein.

In the drawings, the spatially relative terms are intended to encompass different orientations in addition to the orientation as depicted in the figures. Moreover, the size and thickness of each component shown in the drawings are arbitrarily shown for ease of understanding and description, and the invention does not limit the size and thickness of each component.

Embodiment 1

This embodiment provides a display panel 1. In this embodiment, the display panel is mini LED. In other embodiments, the display panel 1 may also be a liquid crystal display (LCD), micro LED, or the like.

Figure 4:
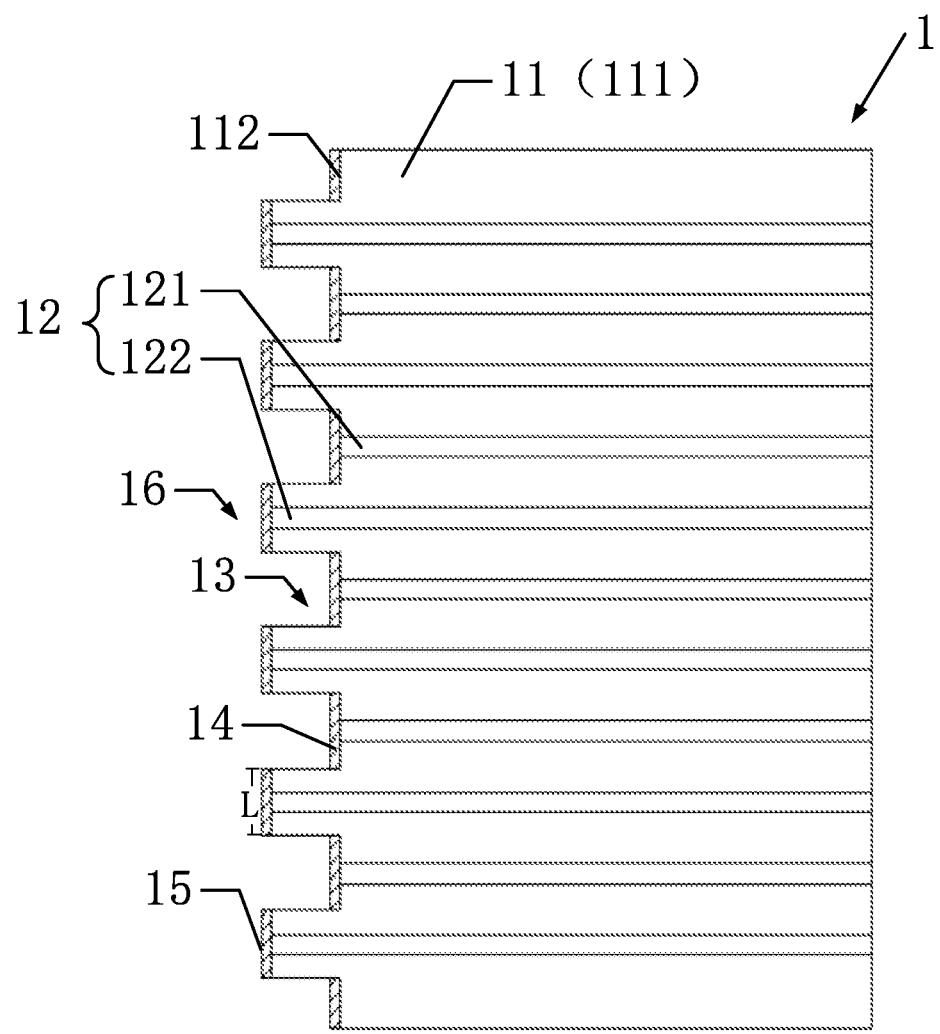
FIG. 4 is a top view of the display panel after the side printing according to the present invention.

As shown in FIG. 4, the display panel 1 includes a substrate 11, a plurality of bonding terminals 12, a plurality of first grooves 13, a plurality of first conductors 14 and a plurality of second conductors 15.

The substrate 11 includes one of a glass plate, a printed circuit board, a BT resin plate, and an aluminum plate. In this embodiment, the substrate 11 is a glass plate.

The substrate 11 includes a first surface 111 and a side printing surface 112 perpendicular to the first surface 111.

In fact, the display panel 1 of this embodiment further includes a driving layer, and the driving layer includes a thin film transistor device. In other embodiments, the driving layer may further include driving chips, such as: micro IC, PM driving IC, etc.

The bonding terminals 12 are disposed in parallel at intervals on a first surface 111 of the substrate 11, so that it is possible to prevent adjacent ones of the bonding terminals 12 from contacting each other to form a short circuit. In this embodiment, one end of the bonding terminal 12 is electrically connected to the thin film transistor device in the driving layer of the display panel 1.

The bonding terminals 12 include alternately arranged first bonding terminals 121 and second bonding terminals 122. In this embodiment, the first bonding terminal 121 and the second bonding terminal 122 are made of the same material. In this embodiment, each of the first bonding terminal 121 and the second bonding terminal 122 is formed of a single wire. In other embodiments, the first bonding terminal 121 may be formed from multiple wires, and the second bonding terminal 122 may also be formed from multiple wires.

The first grooves 13 are disposed on the side printing surface 112 of the substrate 11 at intervals. The first grooves 13 are disposed in a one-to-one correspondence with the first bonding terminals 121. That is, each of the first grooves 13 corresponds to one of the first bonding terminals 121. A first protrusion 16 is formed between any adjacent two of the first grooves 13. The two sidewalls of the first groove 13 also respectively serve as the sidewalls of the two first protrusions 16 adjacent to the first groove 13.

The first groove 13 may be fabricated by a method such as laser cutting, water jet cutting, dry etching, or wet etching.

Any two of the first grooves 13 have the same shape and size, and any two of the first protrusions 16 have the same width L. Thus, a difficulty of the manufacturing process of the first grooves 13 can be reduced.

The first conductors 14 are disposed on the substrate 11 on the bottom surface of the first groove 13. The first conductors 14 are disposed in a one-to-one correspondence with the first grooves 13 and are connected to the first bonding terminals 121 in a one-to-one correspondence. That is, the first conductors 14, the first grooves 13 are disposed in a one-to-one correspondence with the first bonding terminals 121. In this embodiment, the material of the first conductors 14 is silver paste. In other embodiments, the first conductors 14 may be conductive liquid made of other materials.

The second conductors 15 are disposed on the substrate 11 on top surfaces of the first protrusions 16, the second conductors 15 are disposed in a one-to-one correspondence with the first protrusions 16, and are connected to the first protrusions 16 in a one-to-one correspondence, and are connected to the second bonding terminals 122 in a one-to-one correspondence. The material of the second conductor 15 in this embodiment is the same as the material of the first conductor 14, so that the printing device can simultaneously manufacture the first conductor 14 and the second conductor 15, thereby improving the printing efficiency and reducing the manufacturing cost. The first conductor 14 and the second conductor 15 of the present invention are not disposed on the same plane, which can reduce the risk of short circuit between the first conductor 14 and the second conductor 15.

Any one of the first conductors 14 and any one of the second conductors 15 are non-conductive to each other, thereby preventing a short circuit between the first conductor 14 and the second conductor 15.

Figure 5:
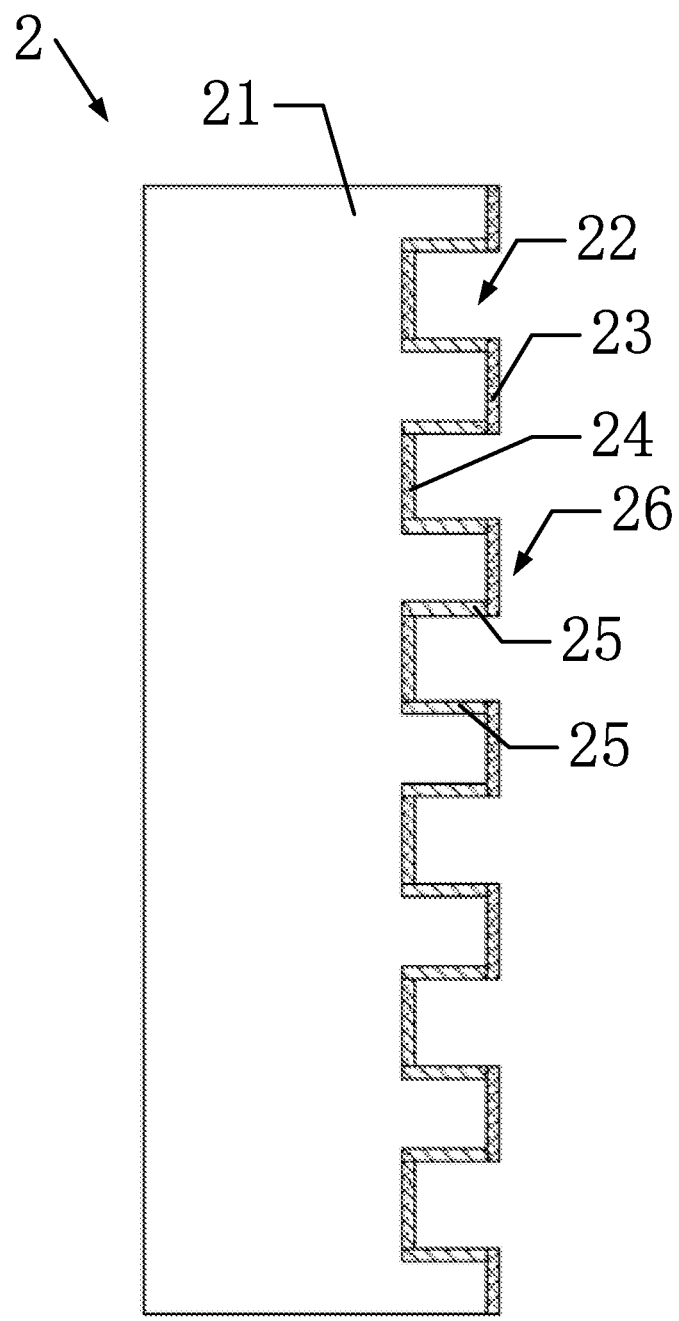
FIG. 5 is a schematic diagram of the printing device according to the present invention.

As shown in FIG. 5, this embodiment provides a printing device 2 for preparing the display panel 1 of the present invention. The printing device 2 includes: a main body 21, second grooves 22, first printing heads 23, second printing heads 24, hydrophobic and oleophobic layers 25, and a second protrusions 26.

A plurality of second grooves 22 are arranged on a surface of one side of the main body 21 at intervals; a second protrusion 26 is formed between any adjacent two of the second grooves 22. Two sidewalls of each of the second groove 22 also serve as the sidewalls of sidewalls of the two second protrusions 26 adjacent to the second groove 22 respectively.

Any two of the second grooves 22 have the same shape and size, and any two of the second protrusions 26 have the same width. Thus, a difficulty of the manufacturing process of the second grooves 22 can be reduced.

A plurality of first printing heads 23 are mounted on the main body 21 on the top surface of the second protrusions 26; and the first printing heads 23 are disposed in a one-to-one correspondence with the second protrusions 26.

A plurality of second printing heads 24 are mounted on the main body 21 on the bottom surface of the second grooves 22; and the second printing heads 24 are disposed in a one-to-one correspondence with the second grooves 22.

A plurality of hydrophobic and oleophobic layers 25 are disposed on two sidewalls of each of the second grooves 22. The hydrophobic and oleophobic layer 25 is mainly configured to prevent the short circuit between the first conductor 14 and the second conductor 15 caused by the conductive liquid dipped onto the two sidewalls of the second groove 22. The material of the hydrophobic and oleophobic layer 25 depends on the material of the conductive liquid. In this embodiment, the conductive liquid is an oily silver paste, and the oily silver paste is lipophilic. For this kind of silver paste, the material of the hydrophobic and oleophobic layer 25 can be a compound such as metal phosphate, metal polyphosphate, and the like. In other embodiments, the conductive liquid may be water-based silver paste, and the water-based silver paste is oleophobic. For this kind of silver paste, the material of the hydrophobic and oleophobic layer 25 may be: polytetrafluoroethylene, fluorinated polyethylene, or the like.

A distance between two of the hydrophobic and oleophobic layers 25 in any one of the second grooves 22 is greater than or equal to a width of the first protrusion 16. In this embodiment, the distance between the two hydrophobic and oleophobic layers 25 of any one of the second grooves 22 is equal to the width of the first protrusions 16, so that the first protrusions 16 can be fitted in the second grooves 22.

A distance between the hydrophobic and oleophobic layers 25 on two sidewalls of any one of the second protrusions 26 is less than or equal to a width of the first groove 13. In this embodiment, the distance between the hydrophobic and oleophobic layers 25 on the two sidewalls of any one of the second protrusions 26 is equal to the width of the first grooves 13, so that the second protrusions 26 can be fitted into the first grooves 13.

Figure 7:
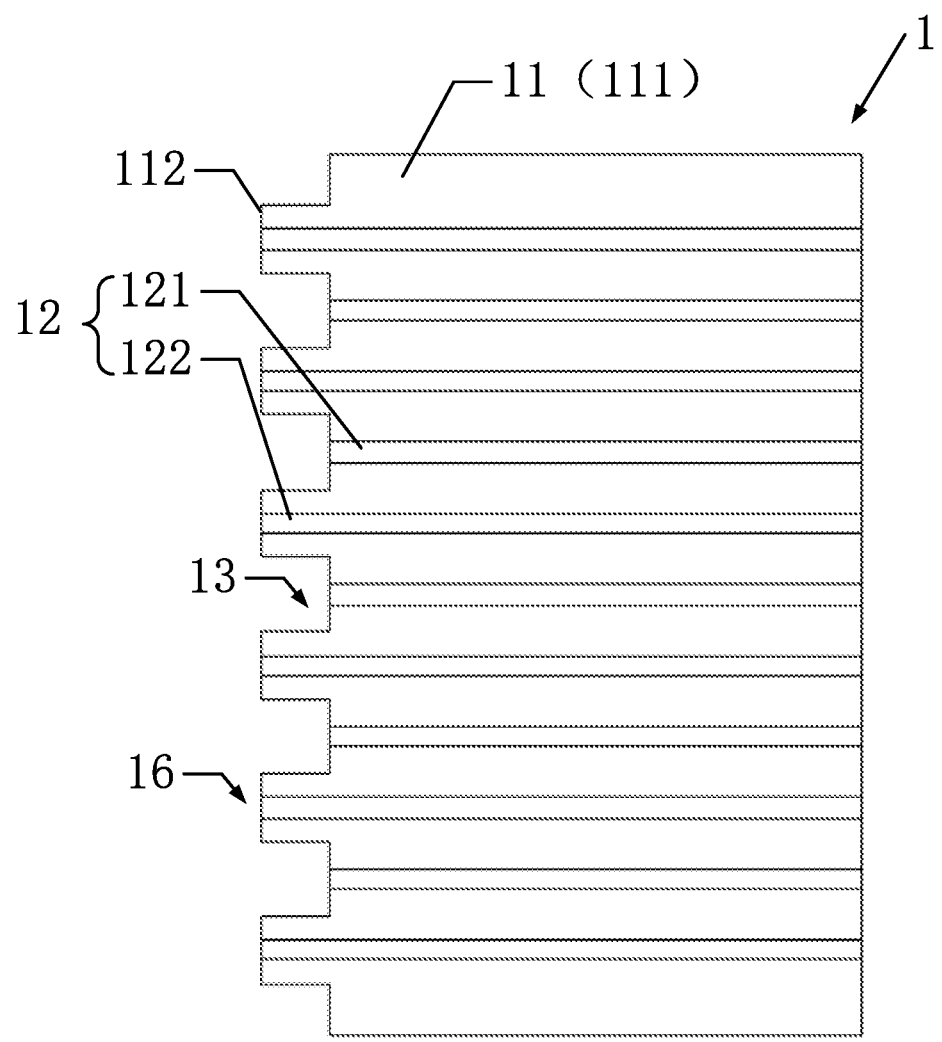
FIG. 7 is a top view of the display panel before the side printing according to the present invention.

As shown in FIG. 6 and FIG. 7, the present invention further provides a method of manufacturing a display panel 1, which includes the following steps: S10: providing a substrate 11, the substrate 11 including a first surface 111 and a side printing surface 112 perpendicular to the first surface 111; S20, forming a plurality of bonding terminals 12 parallel to and spaced apart from each other on the first surface 111 of the substrate 11, wherein the bonding terminals 12 include alternately arranged first bonding terminals 121 and second bonding terminals 122; S30, forming a plurality of first grooves 13 at intervals on the side printing surface 112 of the substrate 11, wherein the first grooves 13 are disposed in a one-to-one correspondence with the first bonding terminals 121; and a first protrusion 16 is formed between any adjacent two of the first grooves 13; and S40: forming first conductors 14 on the substrate 11 on bottom surfaces of the first grooves 13 and forming second conductors 15 on the substrate 11 on top surfaces of the first protrusions 16 by a printing device 2, wherein the first conductors 14 are disposed in a one-to-one correspondence with the first grooves 13, the first conductors 14 are connected to the first bonding terminals 121 in a one-to-one correspondence, the second conductors 15 are disposed in a one-to-one correspondence with the first protrusions 16, the second conductors 15 are connected to the second bonding terminals 122 in a one-to-one correspondence; and any one of the first conductors and any one of the second conductors are non-conductive to each other.

In the present invention, the width of the first conductor 14 and the second conductor 15 can be increased by matching the printing device 2 with the display panel 1, and a risk of the open circuit between the first conductor 14 and the first bonding terminal 121 and the open circuit between the second conductor 15 and the second bonding terminal 122 can be reduced. 122. The first conductor 14 and the second conductor 15 of the present invention are not disposed on the same plane, which can reduce the risk of short circuit between the first conductor 14 and the second conductor 15. The process of the present invention is simple, and the compatibility of the printing device is high.

The step S40 further includes: first providing a hydrophobic and oleophobic layer 25 on two sidewalls of each of the second grooves, then using the printing device 2 to dip a conductive liquid, aligning the first printing heads 23 with the first grooves 13, pressing the main body 21, printing the conductive liquid on the first printing heads 23 to the substrate 11 on the bottom surfaces of the first grooves 13 to form the first conductors 14, and printing the conductive liquid on the second printing heads 24 to the substrate 11 on the top surfaces of the first protrusions 16 to form the second conductors 15.

In the step S40, when the main body 21 is pressed, the first protrusions 16 are fitted into the second grooves 22, and the second protrusions 26 and the second printing heads 24 are fitted into the first grooves 13.

Figure 8:
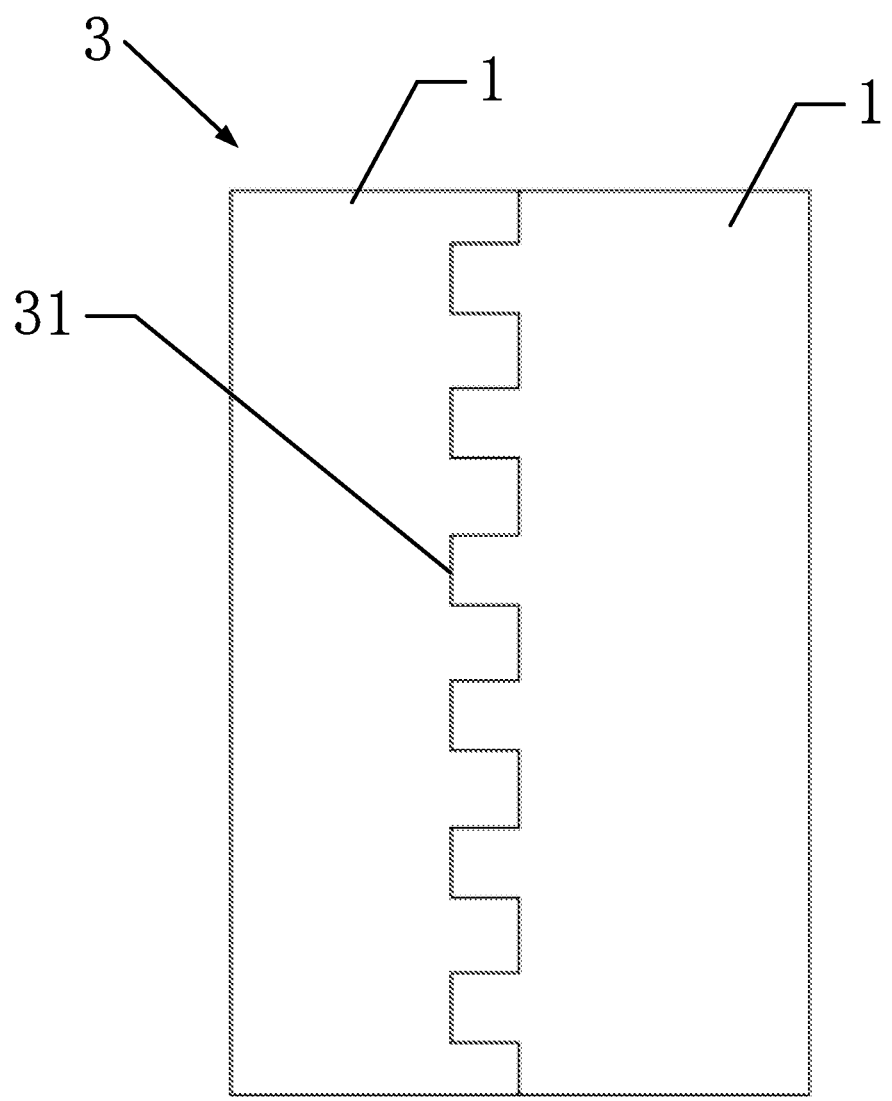
FIG. 8 is a schematic plan view of the splicing display device according to the present invention.

As shown in FIG. 8, this embodiment further provides a splicing display device 3, which is formed by splicing a plurality of display panels 1 of the embodiments of the present invention. The spliced display device 3 includes a splicing seam 31 between adjacent ones of the display panels.

As shown in FIG. 8, the splicing seam 31 in this embodiment is a concave-convex line. Since the user's sensitivity to the contour of the concave-convex line is lower than the user's sensitivity to the straight line. In addition, users are used to observing from left to right and from top to bottom, and the splicing seam 31 in this embodiment requires longer observation time and more information. Therefore, when the display panel 1 of the present invention is spliced, the splicing seam 31 is less obvious, which is beneficial to improve the user experience of the splicing display device 3.

Further, the display panel, the printing device, and the method of manufacturing a display panel provided by the embodiments of the present application are described in detail above. Specific examples are used to explain the principle and implementation of the present application. The descriptions of the above embodiments are only used to help understand the present application. Also, for those skilled in the art, according to the ideas of the present application, there will be changes in the specific implementation and application scope. In summary, the content of this specification should not be construed as limiting the present application.

What is claimed is:

1. A display panel, comprising:
a substrate comprising a first surface and a side printing surface perpendicular to the first surface;
a plurality of bonding terminals disposed in parallel at intervals on a first surface of the substrate; wherein the bonding terminals comprise alternately arranged first bonding terminals and second bonding terminals;
a plurality of first grooves disposed at intervals on the side printing surface of the substrate, wherein the first grooves are disposed in a one-to-one correspondence with the first bonding terminals; and a first protrusion is formed between any adjacent two of the first grooves;
a plurality of first conductors disposed on the substrate on bottom surfaces of the first grooves, wherein the first conductors are disposed in a one-to-one correspondence with the first grooves, and are connected to the first bonding terminals in a one-to-one correspondence; and
a plurality of second conductors disposed on the substrate on top surfaces of the first protrusions, wherein the second conductors are disposed in a one-to-one correspondence with the first protrusions, and are connected to the second bonding terminals in a one-to-one correspondence;
wherein any one of the first conductors and any one of the second conductors are non-conductive to each other.

2. The display panel according to claim 1, wherein a material of the first conductors is same as a material of the second conductors.

3. The display panel according to claim 1, wherein any two of the first grooves have a same shape and size.

4. The display panel according to claim 1, wherein any two of the first protrusions have a same width.

5. A printing device for preparing the display panel according to claim 1, the printing device comprising:
a main body;
a plurality of second grooves disposed on a surface of one side of the main body at intervals, wherein a second protrusion is formed between any adjacent two of the second grooves;
a plurality of first printing heads mounted on the main body on top surfaces of the second protrusions, wherein the first printing heads are disposed in a one-to-one correspondence with the second protrusions; and
a plurality of second printing heads mounted on the main body on bottom surfaces of the second grooves, wherein the second printing heads are disposed in a one-to-one correspondence with the second grooves.

6. The printing device according to claim 5, wherein any two of the second grooves have a same shape and size.

7. The printing device according to claim 5, wherein any two of the second protrusions have a same width.

8. The printing apparatus according to claim 5, further comprising:

a plurality of hydrophobic and oleophobic layers are arranged on two sidewalls of each of the second grooves.

9. The printing device according to claim 8, wherein a material of the hydrophobic and oleophobic layers comprises one or more of metal phosphates, metal polyphosphate compounds, polytetrafluoroethylene, and fluorinated polyethylene.

10. The printing device according to claim 8, wherein a distance between two of the hydrophobic and oleophobic layers in any one of the second grooves is greater than or equal to a width of the first protrusions.

11. The printing device according to claim 8, wherein a distance between the hydrophobic and oleophobic layers on two sidewalls of any one of the second protrusions is less than or equal to a width of the first grooves.

12. A method of manufacturing a display panel, comprising the following steps:
provided a substrate, the substrate comprising a first surface and a side printing surface perpendicular to the first surface;
forming a plurality of bonding terminals parallel to and spaced apart from each other on the first surface of the substrate, wherein the bonding terminals comprise alternately arranged first bonding terminals and second bonding terminals;
forming a plurality of first grooves at intervals on the side printing surface of the substrate, wherein the first grooves are disposed in a one-to-one correspondence with the first bonding terminals; and a first protrusion is formed between any adjacent two of the first grooves; and
forming first conductors on the substrate on bottom surfaces of the first grooves and forming second conductors on the substrate on top surfaces of the first protrusions by a printing device, wherein the first conductors are disposed in a one-to-one correspondence with the first grooves, the first conductors are connected to the first bonding terminals in a one-to-one correspondence, the second conductors are disposed in a one-to-one correspondence with the first protrusions, the second conductors are connected to the second bonding terminals in a one-to-one correspondence; and any one of the first conductors and any one of the second conductors are non-conductive to each other;
wherein the printing device comprises:
a main body;
a plurality of second grooves disposed on a surface of one side of the main body at intervals, wherein a second protrusion is formed between any adjacent two of the second grooves;
a plurality of first printing heads mounted on the main body on top surfaces of the second protrusions, wherein the first printing heads are disposed in a one-to-one correspondence with the second protrusions; and
a plurality of second printing heads mounted on the main body on bottom surfaces of the second grooves, wherein the second printing heads are disposed in a one-to-one correspondence with the second grooves.

13. The method of manufacturing the display panel according to claim 12, wherein any two of the second grooves have a same shape and size.

14. The method of manufacturing the display panel according to claim 12, wherein any two of the second protrusions have a same width.

15. The method of manufacturing the display panel according to claim 12, wherein the step of forming first conductors on bottom surfaces of the first grooves and forming second conductors on top surfaces of the first protrusions further comprises:
first providing a hydrophobic and oleophobic layer on two sidewalls of each of the second grooves, then using the printing device to dip a conductive liquid, aligning the first printing heads with the first grooves, pressing the main body, printing the conductive liquid on the first printing heads to the substrate on the bottom surfaces of the first grooves to form the first conductors, and printing the conductive liquid on the second printing heads to the substrate on the top surfaces of the first protrusions to form the second conductors.

16. The method of manufacturing the display panel according to claim 15, wherein a material of the hydrophobic and oleophobic layers comprises: one or more of metal phosphate, metal polyphosphate compound, polytetrafluoroethylene, and fluorinated polyethylene.

17. The method of manufacturing the display panel according to claim 12, forming the plurality of first grooves at intervals on the side printing surface of the substrate by using one of laser cutting, water jet cutting, dry etching, and wet etching.

18. The method of manufacturing the display panel according to claim 15, wherein a distance between two of the hydrophobic and oleophobic layers in any one of the second grooves is greater than or equal to a width of the first protrusions.

19. The method of manufacturing the display panel according to claim 18, wherein a distance between the hydrophobic and oleophobic layers on two sidewalls of any one of the second protrusions is less than or equal to a width of the first grooves.

20. The method of manufacturing the display panel according to claim 19, wherein when the main body is pressed, the first protrusions are fitted into the second grooves, and the second protrusions and the second printing heads are fitted into the first grooves.

* * * * *